(12) United States Patent
Zimmer et al.

(10) Patent No.: US 11,435,414 B2
(45) Date of Patent: Sep. 6, 2022

(54) DRIFT-COMPENSATED DETECTION OF A DIRECTION OF A MAGNETIC FIELD

(71) Applicant: Infineon Technologies AG, Neubiberg (DE)

(72) Inventors: Juergen Zimmer, Neubiberg (DE); Konrad Kapser, Graefelfing (DE)

(73) Assignee: Infineon Technologies AG, Neubiberg (DE)

( * ) Notice: Subject to any disclaimer, the term of this patent is extended or adjusted under 35 U.S.C. 154(b) by 226 days.

(21) Appl. No.: 16/696,074

(22) Filed: Nov. 26, 2019

(65) Prior Publication Data

US 2020/0200837 A1  Jun. 25, 2020

(30) Foreign Application Priority Data

Dec. 21, 2018 (DE) .......................... 102018222855.8

(51) Int. Cl.
  *G01R 33/02* (2006.01)
  *G01R 33/09* (2006.01)
  *G01R 33/025* (2006.01)

(52) U.S. Cl.
  CPC ......... *G01R 33/025* (2013.01); *G01R 33/093* (2013.01); *G01R 33/096* (2013.01); *G01R 33/098* (2013.01)

(58) Field of Classification Search
  CPC ........................... G01R 33/025; G01R 33/093
  See application file for complete search history.

(56) References Cited

U.S. PATENT DOCUMENTS

| | | | |
|---|---|---|---|
| 9,207,291 B2 * | 12/2015 | Zimmer | G01R 33/096 |
| 9,316,706 B2 * | 4/2016 | Granig | G01R 33/0047 |
| 9,817,085 B2 * | 11/2017 | Zimmer | G01R 33/098 |
| 2016/0161289 A1 * | 6/2016 | Fujita | G01D 5/24471 324/207.21 |
| 2017/0356966 A1 | 12/2017 | Romero | |

FOREIGN PATENT DOCUMENTS

DE  102014115113 A1  4/2015

* cited by examiner

*Primary Examiner* — Reena Aurora
(74) *Attorney, Agent, or Firm* — Harrity & Harrity, LLP

(57) ABSTRACT

A magnetic field sensor for detecting a direction of a magnetic field comprises an xMR sensor designed to produce an xMR sine signal and an xMR cosine signal based on the magnetic field, and an AMR sensor designed to produce an AMR sine signal and/or an AMR cosine signal based on the magnetic field. A processing circuit is designed to determine the direction of the magnetic field using the xMR sine signal, the xMR cosine signal, a first phase difference between the xMR sine signal and the AMR sine signal or the AMR cosine signal, and a second phase difference between the xMR cosine signal and the AMR sine signal or the AMR cosine signal.

25 Claims, 9 Drawing Sheets

DRIFT-COMPENSATED DETECTION OF A DIRECTION OF A MAGNETIC FIELD

CROSS REFERENCE TO RELATED APPLICATION

This application claims priority under 35 U.S.C. § 119 to German Patent Application No. 102018222855.8 filed on Dec. 21, 2018, the contents of which are incorporated by reference herein in their entirety.

TECHNICAL FIELD

The present disclosure relates to magnetic field sensors and methods for detecting the direction of a magnetic field using xMR sensors.

BACKGROUND

GMR angle sensors or TMR angle sensors can be used to detect the direction of a magnetic field. GMR is an abbreviation for giant magnetoresistance and TMR is an abbreviation for tunneling magnetoresistance. To refer to GMR angle sensors and TMR angle sensors, the umbrella term xMR angle sensors is used here. GMR angle sensors are based on the GMR measurement principle and TMR angle sensors are based on the TMR measurement principle. Both measurement principles use at least one layer with a fixed magnetization direction as a reference layer. GMR angle sensors and TMR angle sensors, e.g., xMR angle sensors, as the term is used herein, are able to measure the direction of a magnetic field over a complete angle range of 360°. Consequently, such angle sensors are suitable for applications in which the position of a rotating component, for example a rotor in an electric drive or a shaft in a motor vehicle, should be measured.

An inherent problem of xMR angle sensors is that the magnetization direction of the reference layer, which defines a zero-angle direction for the respective application, is not stable over the service life of the sensor. Depending on the applied magnetic field and the temperature, this reference magnetization may drift and change its direction, having a drift of the zero angle as a consequence. On account of this effect, the detection accuracy of a sensor arrangement employing an xMR angle sensor may be reduced with increasing service life, leading to an increased angle error during the detection.

In addition to xMR sensors, AMR sensors are known, AMR being an abbreviation for anisotropic magnetoresistive effect. AMR sensors are able to measure the direction of a magnetic field over an angle range of 180°. However, AMR sensors are not able to detect the direction of a magnetic field over a whole angle range of 360°.

OVERVIEW

Magnetic field sensors and methods that facilitate an accurate detection of the direction of a magnetic field during the service life of a magnetic field sensor would be desirable.

Examples of the present disclosure develop a magnetic field sensor for detecting a direction of a magnetic field, the magnetic field sensor comprising an xMR sensor designed to produce an xMR sine signal and an xMR cosine signal based on the magnetic field and an AMR sensor designed to produce an AMR sine signal and/or an AMR cosine signal based on the magnetic field. The magnetic field sensor comprises a processing circuit designed to determine the direction of the magnetic field using the xMR sine signal, the xMR cosine signal, a first phase difference between the xMR sine signal and the AMR sine signal or AMR cosine signal, and a second phase difference between the xMR cosine signal and the AMR sine signal or AMR cosine signal.

Examples of the present disclosure develop a method for detecting a direction of a magnetic field, in which an xMR sine signal and an xMR cosine signal are obtained based on the magnetic field using an xMR sensor. An AMR sine signal and/or an AMR cosine signal is obtained based on the magnetic field using an AMR sensor. The direction of the magnetic field is determined using the xMR sine signal, the xMR cosine signal, a first phase difference between the xMR sine signal and the AMR sine signal or AMR cosine signal, and a second phase difference between the xMR cosine signal and the AMR sine signal or AMR cosine signal.

According to examples of the present disclosure, at least one output signal of an AMR sensor is used to compensate a zero-angle drift of output signals of an xMR sensor. Here, examples of the present disclosure use the discovery that AMR sensors have a reference direction that is stable over temperature, magnetic field strength and service life since the reference direction is not based on a magnetization but on a current flow direction. Consequently, examples of the present disclosure are based on adding an AMR-based structure to an xMR-based structure in order to facilitate an angle detection over an angle range of 360° and, in the process, facilitate a compensation of a zero-angle drift.

BRIEF DESCRIPTION OF THE DRAWINGS

Examples of the present disclosure are described below with reference to the attached drawings. In detail.

DETAILED DESCRIPTION

Hereinafter, examples of the present disclosure are described in detail and using the attached drawings. It should be pointed out that identical elements or elements having the same functionality may be provided with identical or similar reference signs, a repeated description of elements provided with the same or similar reference signs typically being omitted. Descriptions of elements having identical or similar reference signs are mutually interchangeable. In the following description, many details are described in order to yield a more thorough explanation of examples of the disclosure.

However, it is evident to those skilled in the art that other examples can be implemented without these specific details. Features of the various examples described can be combined with one another, unless features of a corresponding combination are mutually exclusive or such a combination is expressly excluded.

Figure 1:
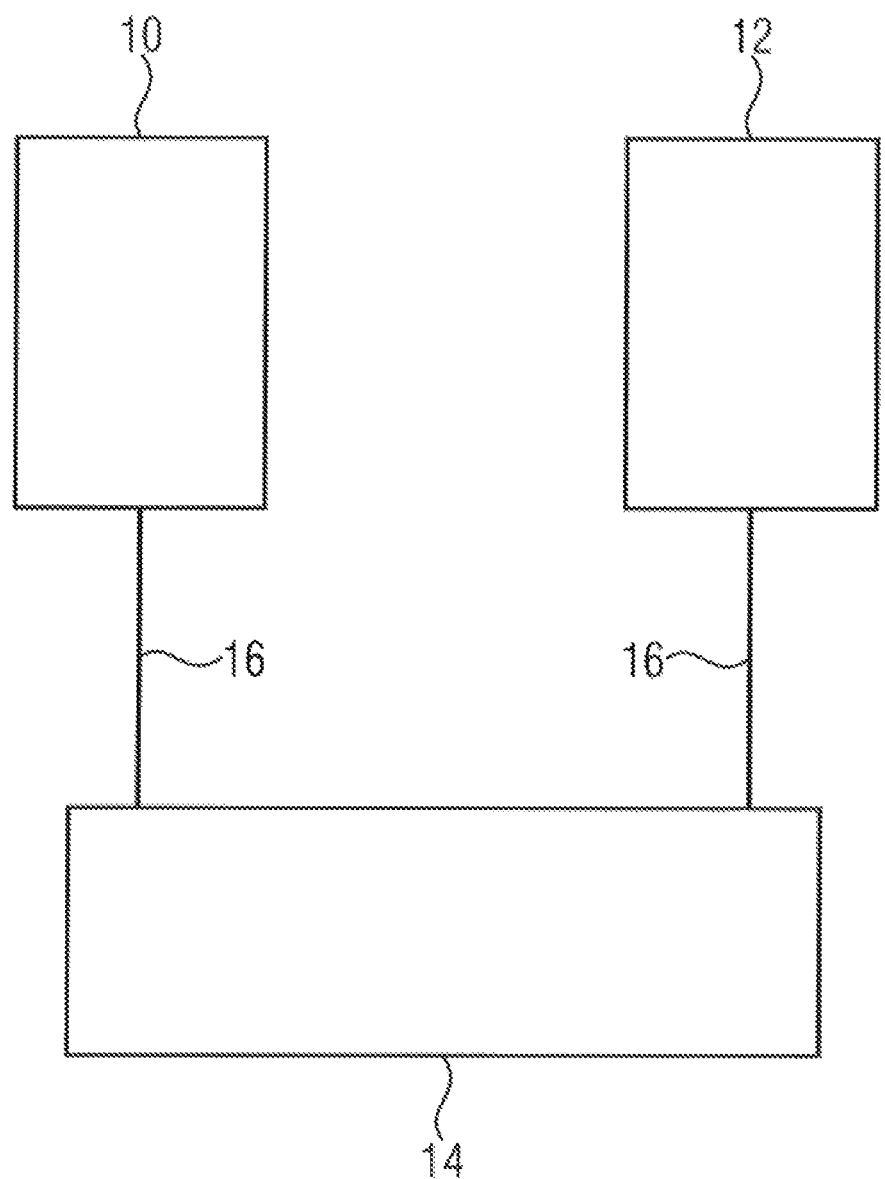
FIG. 1 shows a schematic illustration of an example of a magnetic field sensor according to the present disclosure.

FIG. 1 schematically shows a magnetic field sensor according to one example of the present disclosure, the magnetic field sensor comprising an xMR sensor 10, an AMR sensor 12 and a processing circuit 14. The processing circuit 14 is coupled so as to allow communication with the xMR sensor 10 and the AMR sensor 12, for example in a wired or wireless fashion, as shown by communication links 16 in FIG. 1. The xMR sensor 10 produces an xMR sine signal and an xMR cosine signal based on a magnetic field produced by a magnetic field transducer. The magnetic field transducer can be designed to produce a magnetic field with a changing direction, such as a rotating dipole magnet, for example. The AMR sensor 12 produces an AMR sine signal and/or an AMR cosine signal based on the magnetic field. In examples, the AMR sensor produces an AMR sine signal and an AMR cosine signal. The processing circuit 14 determines the angle, and hence the direction of the magnetic field, using the xMR sine signal, the xMR cosine signal, a first phase difference between the xMR sine signal and the AMR sine signal or AMR cosine signal, and a second phase difference between the xMR cosine signal and the AMR sine signal or AMR cosine signal.

In examples, the xMR sensor and the AMR sensor may each have sensor elements that are interconnected in a bridge circuit in order to output the sine and cosine signals. In examples, it is sufficient for the AMR sensor to only output one of the two signals.

In general, corrections can be carried out in output signals of xMR sensors and AMR sensors in order to compensate amplitude differences between the sine and cosine signals, in order to compensate a bridge offset and in order to compensate orthogonality errors in output signals of xMR sensors. However, until now, there has not been any option for compensating a zero-angle drift in xMR sensors without an external reference. However, an external reference is usually not available when the sensor is used. However, the compensation of the zero-angle drift is a challenge for realizing highly accurate angle sensors that can operate at high temperatures and in strong magnetic fields. Examples of the present disclosure facilitate such a compensation by the use of an AMR structure, which specifies the absolute zero-angle reference direction. In examples of the present disclosure, the output signal of the AMR structure is used to compensate a zero-angle drift of the xMR sensor without an external reference. Examples of the disclosure consequently exploit the stability of the AMR structure in order to compensate a zero-angle drift of the xMR sensor while a measurement range of 360°, which the xMR sensor has, can be maintained.

The zero-angle drift of the xMR sensor may bring about a phase shift of the output signals of the xMR sensor, e.g., the xMR sine signal and the xMR cosine signal, relative to a reference angle, the zero angle. Here, the two output signals may experience a different deviation from the reference angle as a result of the drift. In order to compensate this deviation, at least one output signal of an AMR sensor is used in examples of the disclosure. More precisely, a first phase difference is determined between the xMR sine signal and an output signal of the AMR sensor and a second phase difference is determined between the xMR cosine signal and an output signal of the AMR sensor. Then, the deviations of the output signals of the xMR sensor from the reference angle are compensated based on the determined phase differences.

In examples, the AMR sensor produces an AMR sine signal and an AMR cosine signal, wherein the first phase difference is the phase difference between the xMR sine signal and the AMR sine signal and the second phase difference is the phase difference between the xMR cosine signal and the AMR cosine signal. However, since the output signals of the AMR sensor over the service life of same have a predetermined fixed phase relationship of 90° with respect to one another, which is not subject to drift, the first and second phase difference can also be determined using the same output signal of the AMR sensor in other examples.

In examples, the processing circuit is designed to determine the phase differences when a magnetic field is present in a specific direction. The fact that the magnetic field is present in the specific direction can be determined in this case using the AMR sine signal and/or the AMR cosine signal as these signals are not subject to drift in relation to the reference angle. In examples, the specific direction lies in a certain range about 22.5°. In examples, the specific direction lies in a range of $22.5°-P_{AMR} \pm 22.5°$, where $P_{AMR}$ is a phase offset of the AMR sine signal and the AMR cosine signal relative to the reference angle or reference system. It was recognized that the phase differences between the output signals of the xMR sensor and the AMR sensor can be reliably determined in this range. Here, the phase differences can be determined periodically during the service life of the magnetic field sensor in order to compensate zero-angle drifts of the xMR sensor during the operation of same. Here, the phase offset Pan, R of the output signal or the output signals of the AMR sensor relative to the reference system can be determined during the initial calibration of the magnetic field sensor since the latter does not change during the service life of the magnetic field sensor.

In examples of the disclosure, the processing circuit can further be designed to carry out a correction of the output signals of the xMR sensor and the AMR sensor with respect to amplitude inequalities (synchronism) and a bridge offset. Such corrections can be carried out in conventional fashion. Here, an amplitude synchronism should be understood to mean the matching of the amplitudes of the various output signals of the sensors to one another. Here, correcting a bridge offset should be understood to mean a correction of the electrical offset of sensor elements of the sensors interconnected into a bridge. In examples, the processing circuit consequently carries out an amplitude correction and/or a bridge offset correction with respect to the xMR sine signal and the xMR cosine signal and with respect to the AMR sine signal and/or the AMR cosine signal.

In examples, the processing circuit can be designed to carry out a correction of a non-orthogonality between the xMR sine signal and the xMR cosine signal using a difference between the second phase difference and the first phase difference.

Examples of the present disclosure consequently facilitate a complete compensation of zero-angle drifts of the output signals of an xMR sensor during the service life of same without an external reference, following an initial calibration.

Figure 2:
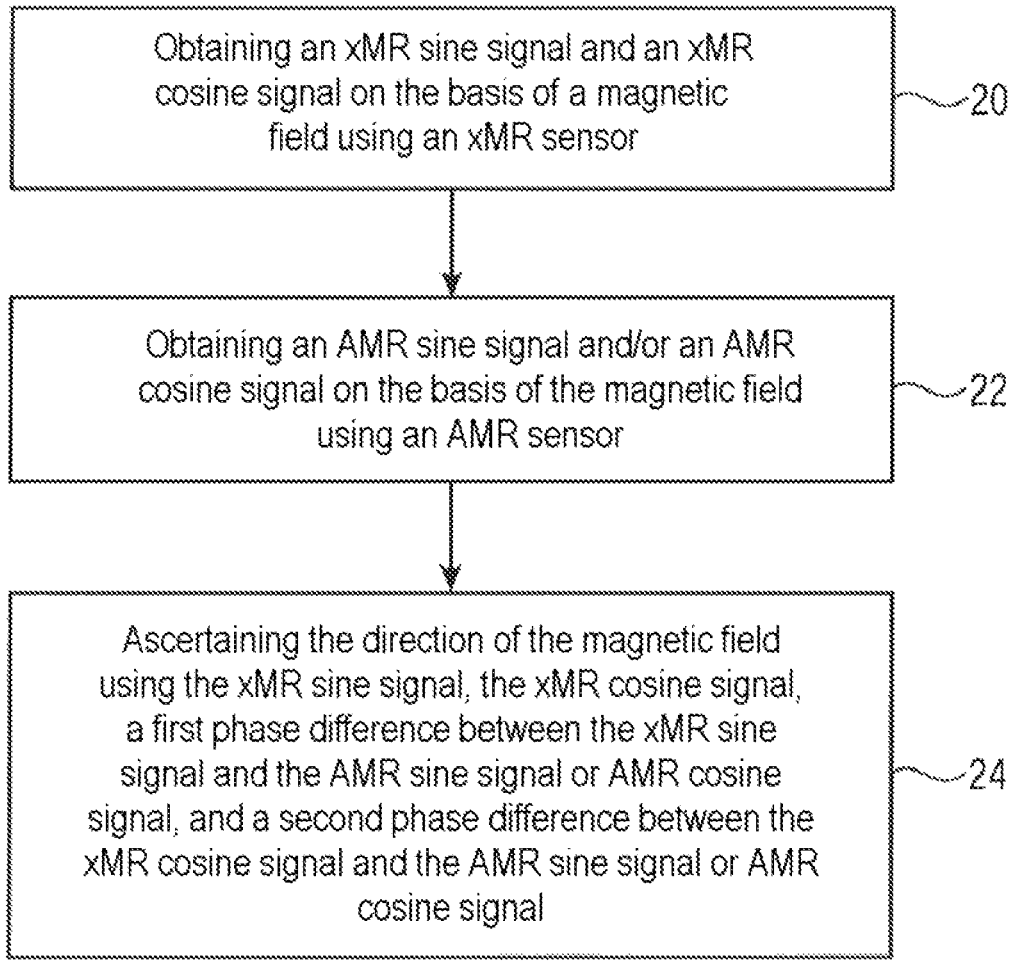
FIG. 2 shows a flowchart of a method according to the present disclosure.

As shown in FIG. 2, examples of the present disclosure develop methods for detecting a direction of a magnetic field. An xMR sine signal and an xMR cosine signal are obtained at 20 based on the magnetic field using the xMR sensor. An AMR sine signal and/or an AMR cosine signal is or are obtained at 22 based on the magnetic field using the AMR sensor. The direction of the magnetic field is obtained at 24 using the xMR sine signal, the xMR cosine signal, a first phase difference between the xMR sine signal and the AMR sine signal or AMR cosine signal, and a second phase difference between the xMR cosine signal and the AMR sine signal or AMR cosine signal.

In examples of the present disclosure, an xMR structure and an AMR structure are placed in a housing. The processing circuit can likewise be provided in the housing, or else it can be provided externally. The AMR structure yields the absolute zero-angle reference direction, and so the drift of the reference direction of a GMR or TMR sensor (xMR sensor) can be compensated by exploiting the fact that the AMR structure remains stable during the service life of same. Consequently, it is possible to implement algorithms that compensate a zero-angle drift of the xMR structure over the service life of same using the AMR structure as a reference.

In examples, such a compensation is obtained by virtue of a phase offset of each of the xMR output signals being determined relative to a reference phase formed by one or more output signals of an AMR sensor during the operation of the magnetic field sensor and this phase offset being taken into account when determining the direction of the magnetic field.

A specific example of how such a compensation can be implemented is described in detail below. However, it is evident to persons skilled in the art that other examples need not implement all details, for example with respect to additional compensations such as, e.g., an amplitude correction or a bridge offset correction and with respect to the specific sequence of how the compensation is implemented in the following example.

There is a calibration of the magnetic field sensor at an initial time, e.g., upon or immediately following the production of the magnetic field sensor. Data detected at the initial time are appended with 0 h below. During the calibration (0 h), raw sine and cosine data of both sensors are usually recorded for at least one complete rotation of the magnetic field through 360° in order to compensate amplitude inequalities and bridge offsets.

In examples, the following actions can be carried out during the sensor calibration:

a) correcting the sine/cosine signals with respect to amplitude/synchronism $$\left(e.g., \frac{\text{Amplitude}_{sin}}{\text{Amplitude}_{cos}}\right)$$

and with respect to a bridge offset for the xMR sensor and normalization (such that signals supply values of between −1 and 1, for example);

b) correcting the sine/cosine signals with respect to amplitude/synchronism and with respect to a bridge offset for the AMR sensor and normalization (such that signals supply values of between −1 and 1, for example);

c) calculating the (angle-dependent) arcsine (ARCSIN) of the AMR sine signal (ARCSIN_AMR_0 h);

d) calculating the (angle-dependent) arccosine (ARCCOS) of the AMR cosine signal (ARCCOS_AMR_0 h);

e) calculating the (angle-dependent) arcsine (ARCSIN) of the xMR sine signal (ARCSIN_xMR_0 h);

f) calculating the (angle-dependent) arccosine (ARCCOS) of the xMR cosine signal (ARCCOS_xMR_0 h).

It should be noted that it is not necessary to correct/displace the phases of all sensor raw data to the zero angle of the measurement system, e.g., of the reference system, in this case. However, should carrying out a phase correction with respect to the measurement system be desired, this can be implemented according to the procedure set forth below. The assumption is made that the AMR and xMR output signals, which may be bridge signals, exhibit the following behavior:

$$V_{AMR_{Sin}}(\alpha) \sim \text{SIN}(2*(\alpha + P_{AMR_{Sin}}))$$

$$V_{AMR_{Cos}}(\alpha) \sim \text{COS}(2*(\alpha + P_{AMR_{Cos}}))$$

$$V_{xMR_{Sin}}(\alpha) \sim \text{SIN}(\alpha + P_{xMR_{Sin}})$$

$$V_{xMR_{Cos}}(\alpha) \sim \text{COS}(\alpha + P_{xMR_{Cos}})$$

Here, $\alpha$ represents the direction of the magnetic field, $V_{AMR_{Sin}}(\alpha)$ represents the raw sine signal of the AMR sensor, $V_{AMR_{Cos}}(\alpha)$ represents the raw cosine signal of the AMR sensor, $V_{xMR_{Sin}}(\alpha)$ represents the raw sine signal of the xMR sensor and $V_{xMR_{Cos}}(\alpha)$ represents the raw cosine signal of the xMR sensor. $P_{AMR_{Sin}}$ represents a phase offset of the sine signal of the AMR sensor relative to an external reference system, $P_{AMR_{Cos}}$ represents a phase offset of the cosine signal of the AMR sensor relative to the external reference system, $P_{xMR_{Sin}}$ represents a phase offset of the sine signal of the xMR sensor relative to the external reference system and $P_{xMR_{Cos}}$ represents a phase offset of the cosine signal of the xMR sensor relative to the external reference system.

The phase offsets of the individual raw signals, e.g., $P_{AMR_{Sin}}$, $P_{AMR_{Cos}}$, $P_{xMR_{Sin}}$, $P_{xMR_{Cos}}$ can be calculated during the calibration by way of an arcsine calculation (ARCSIN) and an arccosine calculation (ARCCOS) of the individual raw signals relative to the external field angle $\alpha$. Using these values for the phase offsets, the raw data $V_{AMR_{Sin}}(\alpha)$, $V_{xMR_{Sin}}(\alpha)$ and $V_{xMR_{Cos}}(\alpha)$ can be phase-shifted to an angle of 0° with respect to the external reference angle. However, it is expressly noted that such a displacement is purely optional and is not implemented in examples of the present disclosure.

$$V'_{AMRSin_{new}}(\alpha) = \frac{\left(V_{AMR_{Sin}}(\alpha) - \frac{V_{AMR_{Cos}}(\alpha) \cdot \sin(2 \cdot P_{AMR_{Sin}})}{\cos(2 \cdot P_{AMR_{Cos}})}\right)}{\cos(2 \cdot P_{AMR_{Sin}}) + \frac{\sin(2 \cdot P_{AMR_{Sin}}) \cdot \sin(2 \cdot P_{AMR_{Cos}})}{\cos(2 \cdot P_{AMR_{Cos}})}} \quad \text{Eq. 1}$$

$$V'_{AMRCos_{new}}(\alpha) = \frac{\left(V_{AMR_{Sin}}(\alpha) + \frac{V_{AMR_{Cos}}(\alpha) \cdot \cos(2 \cdot P_{AMR_{Sin}})}{\sin(2 \cdot P_{AMR_{Cos}})}\right)}{\sin(2 \cdot P_{AMR_{Sin}}) + \frac{\cos(2 \cdot P_{AMR_{Sin}}) \cdot \cos(2 \cdot P_{AMR_{Cos}})}{\sin(2 \cdot P_{AMR_{Cos}})}} \quad \text{Eq. 2}$$

$$V'_{xMRSin_{new}}(\alpha) = \frac{\left(V_{xMR_{Sin}}(\alpha) - \frac{V_{xMR_{Cos}}(\alpha) \cdot \sin(P_{xMR_{Sin}})}{\cos(P_{xMR_{Cos}})}\right)}{\cos(P_{xMR_{Sin}}) + \frac{\sin(P_{xMR_{Sin}}) \cdot \sin(P_{xMR_{Cos}})}{\cos(p_{xMR_{Cos}})}} \quad \text{Eq. 3}$$

$$V'_{xMRCos_{new}}(\alpha) = \frac{\left(V_{xMR_{Sin}}(\alpha) + \frac{V_{xMR_{Cos}}(\alpha) \cdot \cos(P_{xMR_{Sin}})}{\sin(P_{xMR_{Cos}})}\right)}{\sin(P_{xMR_{Sin}}) + \frac{\cos(P_{xMR_{Sin}}) \cdot \cos(P_{xMR_{Cos}})}{\sin(p_{xMR_{Cos}})}} \quad \text{Eq. 4}$$

Following the transformation of the raw signals of the sensors brought about by equations Eq. 1 to Eq. 4, the phase of the transformed signals $V'_{AMRSin_{new}}(\alpha)$, $V'_{AMRCos_{new}}(\alpha)$, $V'_{xMRSin_{new}}(\alpha)$, $V'_{xMRCos_{new}}(\alpha)$ is 0° with respect to the external field direction.

Figure 3:
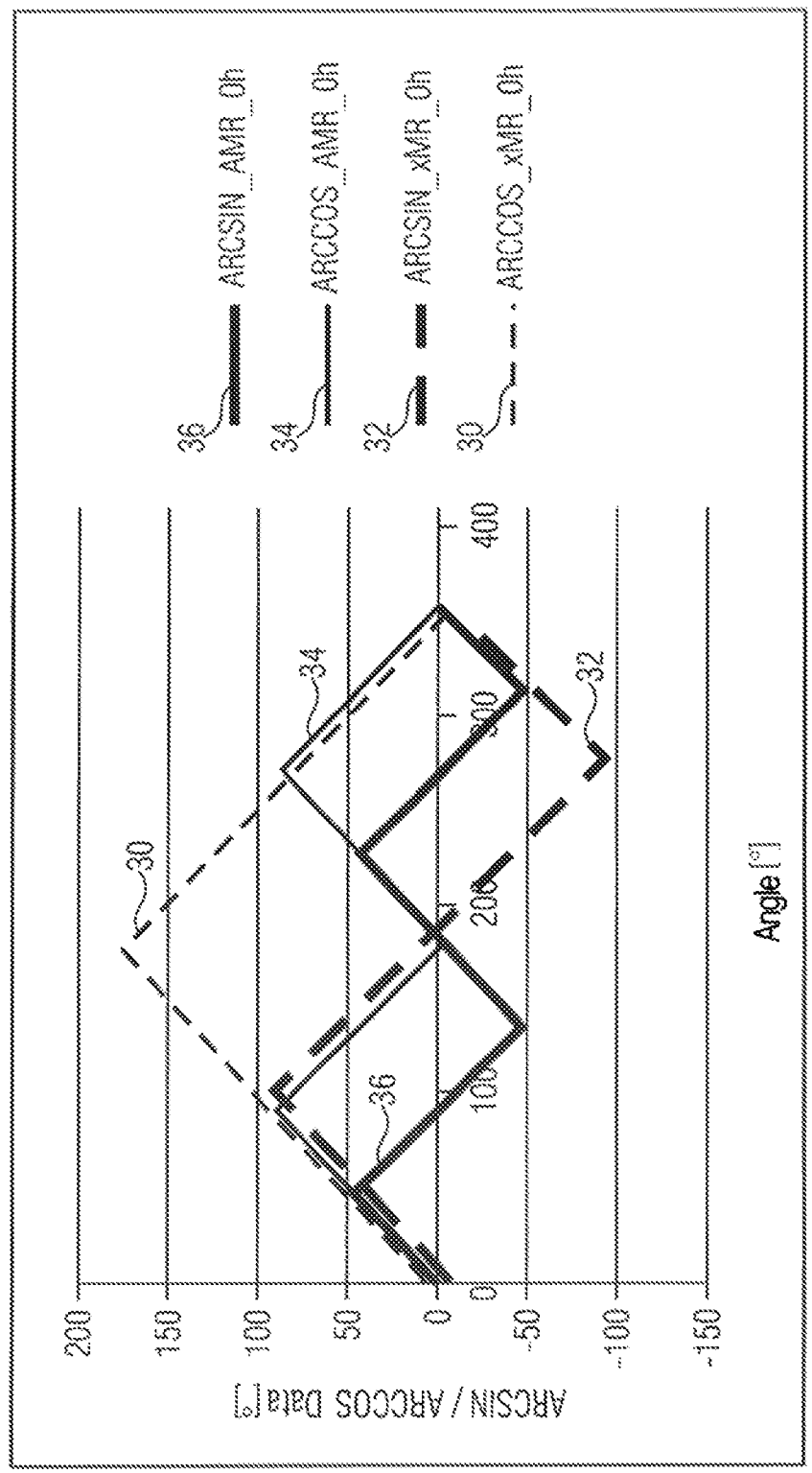
FIG. 3 shows a signal diagram showing raw data based on signals of an xMR sensor and an AMR sensor at an initial time.

The ARCSIN/ARCCOS calculation of the output signals of the AMR sensor and the xMR sensor as a function of the external angle at the calibration time 0 h is shown in FIG. 3. It should be noted that the output signals will be normalized, amplitude-corrected and bridge-offset-corrected raw data as a rule, as explained above. In examples, this may also relate to uncorrected raw data should such corrections not be required.

In the example shown in FIG. 3, the xMR sine signal 32 and the xMR cosine signal 30 are phase-shifted by −10° and +10° with respect to the external measurement angle. In the example shown in FIG. 3, the AMR cosine signal 34 and the AMR sine signal 36 have no phase shift with respect to the external measurement angle. It should be noted that these phase shifts are purely examples.

A calculation of the angle-dependent difference between the calculated arcsine and arccosine signals of the xMR sensor and the AMR sensor can be implemented as follows:

$$\text{DIFF\_ARCSIN\_0 h}(\alpha) = \text{ARCSIN\_}xMR\_0\ h(\alpha) - \text{ARCSIN\_}AMR\_0\ h(\alpha) \qquad \text{Eq. 5}$$

$$\text{DIFF\_ARCCOS\_0 h}(\alpha) = \text{ARCCOS\_}xMR\_0\ h(\alpha) - \text{ARCCOS\_}AMR\_0\ h(\alpha) \qquad \text{Eq. 6}$$

Here, DIFF_ARCSIN_0 h ($\alpha$) represents the difference between the arcsine signals at the calibration time and DIFF_ARCCOS_0 h ($\alpha$) represents the difference between the arccosine signals at the calibration time.

Figure 4:
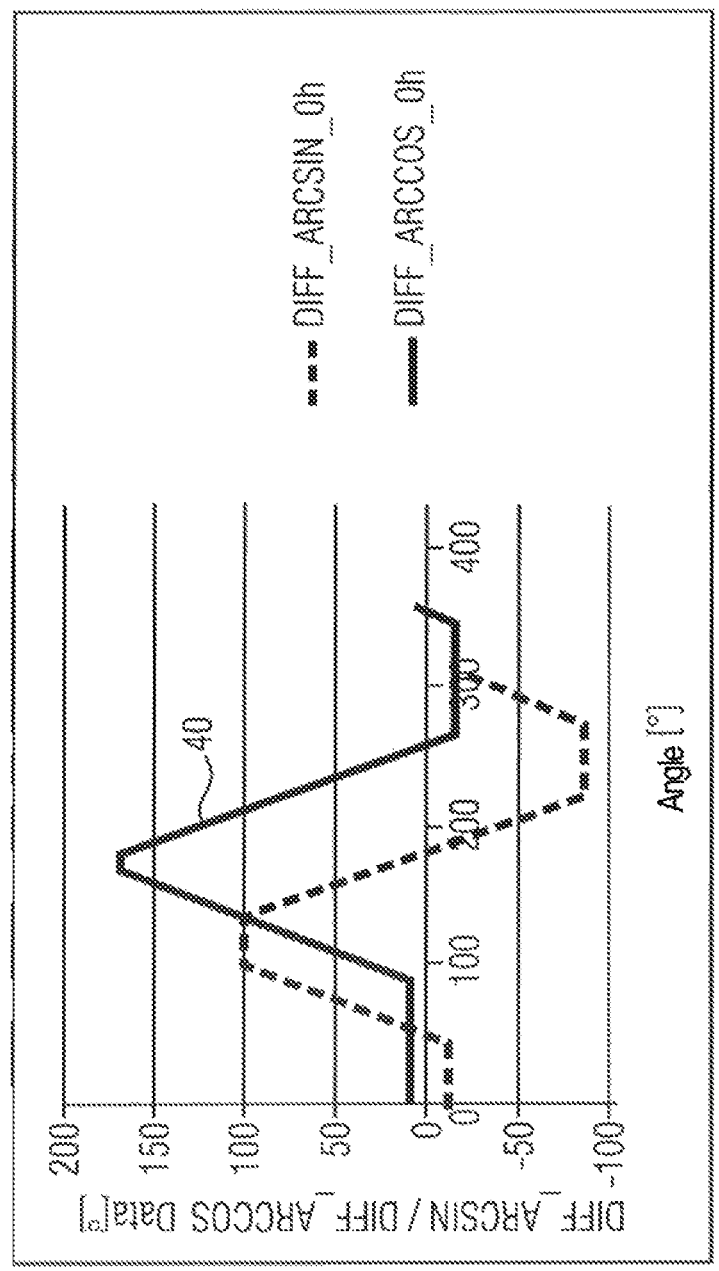
FIG. 4 shows a signal diagram showing a difference between raw data based on signals of the xMR sensor and the AMR sensor at the initial time.
Figure 5:
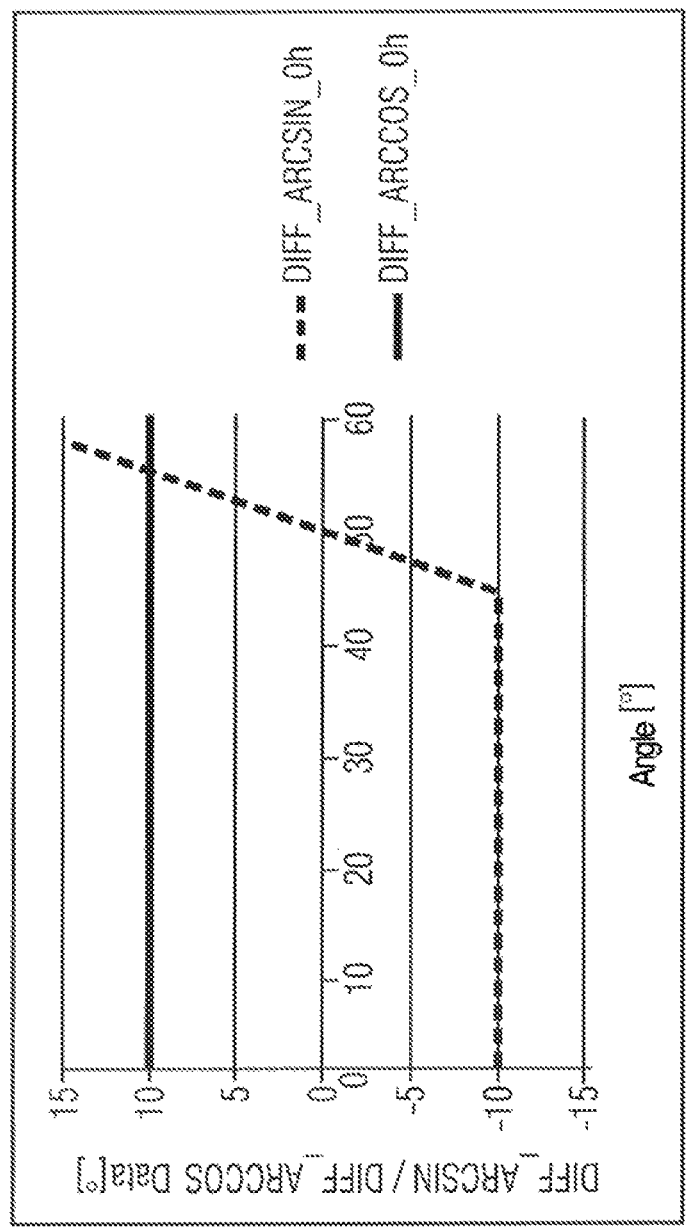
FIG. 5 shows a signal diagram showing a detailed view of the signals in FIG. 4 in an angle range from 0 to 60°.

The difference between the arcsine signals and the arccosine signals can be calculated here as a function of the angle, e.g., of the direction, for the case where the phases of the AMR signals are displaced to the external coordinate system, e.g., the reference system. Expressed differently, $P_{AMR_{Sin}}$ and $P_{AMR_{Cos}}$ are zero. The difference data or difference signals arising from forming the difference are shown in FIG. 4, where a curve 40 shows the difference between the arccosine signals and a curve 42 shows the difference between the arcsine signals. FIG. 5 shows a magnified view of the data in an angle range from 0 to 60°.

As can be identified best in FIG. 5, the difference signal DIFF_ARCSIN_0 h ($\alpha$) directly reflects the phase shift between the xMR and AMR sine signals in a predetermined range about an angle of 22.5° and the difference signal DIFF_ARCCOS_0 h ($\alpha$) directly reflects the phase shift between the xMR and AMR cosine signals. Since the AMR signals are not subject to any drift, even during the later operation during the service life of the magnetic field sensor, these signals can also be referred to as reference signals and the phases of same can also be referred to as reference phases. In the shown example, the phase shifts are 10° for the arccosine signals and −10° for the arcsine signals. In general, the range in which the phase shifts can be measured or determined based on the difference signals lies in a range of 22.5°−$P_{AMR}$±22.5°, where $P_{AMR}$ is the offset of the AMR signals with respect to the external angle, which is zero in the present example.

In examples, the phase offsets for the sine signals and cosine signals can be stored as original state or 0 h state for the phases of the xMR signals.

Usually, the sine and cosine signals can be phase-corrected in respect of a non-orthogonality for a calculation of the angle error as a function of the external angle. The non-orthogonality $\Delta P_{xMR}$ of the output signals of the xMR sensor is defined by:

$$\Delta P_{xMR} = P_{xMR_{Cos}} - P_{xMR_{Sin}} \qquad \text{Eq. 7}$$

Here, the non-orthogonality $\Delta P_{xMR}$ specifies the deviation of the phase difference between the sine signal and the cosine signal of the xMR sensor from 90°.

Since the phases of the output signals of the AMR sensor are defined by the current directions in the individual AMR elements, the non-orthogonality is zero as a result of constructive measures, e.g., $P_{AMR_{Sin}} = P_{AMR_{Cos}} = P_{AMR}$. Further, $P_{AMR}$ is stable over the service life of the sensor.

New signals, in which the non-orthogonality of the xMR sensor has been corrected, are as follows:

$$V'_{xMR_{Cos}}(\alpha) = \frac{V_{xMR_{Cos}}(\alpha)}{\cos(\Delta P_{xMR})} + V_{xMR_{Sin}}(\alpha) \cdot \frac{\text{SIN}(\Delta P_{xMR})}{\text{COS}(\Delta P_{xMR})} \qquad \text{Eq. 8}$$

$$V'_{xMR_{Sin}}(\alpha) = V_{xMR_{Sin}}(\alpha) \qquad \text{Eq. 9}$$

Here, the sine signal $V_{xMR_{Sin}}(\alpha)$ remains unchanged and the cosine signal is orthogonalized with respect to the sine signal. Alternatively, it could also be the cosine signal that remains unchanged and the sine signal could be orthogonalized with respect to the cosine signal.

Based on the orthogonalized output signals of the xMR sensor, the angle of the external magnetic field, B field, in the sensor coordinate system can be calculated as follows:

$$\alpha_{xMR} = \text{ARCTAN}\left(\frac{V'_{xMR_{Sin}}(\alpha)}{V'_{xMR_{Cos}}(\alpha)}\right) \qquad \text{Eq. 10}$$

Here, "sensor coordinate system" should be understood to mean the coordinate system of the xMR sensor, which may be rotated with respect to the external reference coordinate system. In equation 10, the sine signal of the xMR sensor has not yet been shifted in such a way that the phase shift with respect to the external reference coordinate system is zero.

The angle $\alpha_{xMR}$ calculated thus is then corrected in order to compensate a phase shift of the xMR sine signal with respect to the reference angle (reference coordinate system):

$$\alpha'_{xMR} = \alpha_{xMR} - P_{xMR_{Sin}} \qquad \text{Eq. 11}$$

Using the procedure described above with reference to equations Eq. 7 to Eq. 11, the xMR sensor can be calibrated at the initial time, for example immediately following its production. This can be implemented within the scope of a standard 0 h calibration of the xMR sensor and consequently can be implemented with little outlay.

In examples, the phase offsets between the sine signals of the xMR sensor and the AMR sensor and between the cosine signals of the xMR sensor and the AMR sensor can also be determined and stored during the calibration, as described above with reference to FIGS. 4 and 5. In examples, the phase offset Pan, R of the output signals of the AMR sensor relative to the reference coordinate system is stored during the calibration, the phase offset representing a reference phase offset on account of its stability. Should the phase of the AMR sensor already fit to the external angle system, the phase need not be taken into account.

Then, how a drift compensation can be implemented with respect to the detection of the magnetic field direction during the operation and during the service life of the magnetic field sensor is described below. Here, the processing circuit can be designed to carry out such a drift compensation if one or more certain conditions are present. In examples, the predetermined conditions may each comprise the end of a certain operational duration or a certain temperature budget, to which the magnetic field sensor was exposed. In examples, the processing circuit can be designed to carry out such a drift compensation every time the magnetic field sensor is activated.

In examples, the following actions can be carried out for the purposes of compensating the drift. Hereafter, the affix "AC" added to the signals in each case stands for current (actual), in comparison with the affix "0 h" during the calibration.
g) correcting the sine/cosine signals with respect to amplitude/synchronism $$\left( e.g., \frac{Amplitude_{sin}}{Amplitude_{cos}} \right)$$

and with respect to a bridge offset for the xMR sensor and normalization (such that signals supply values of between −1 and 1, for example);
h) correcting the sine/cosine signals with respect to amplitude/synchronism and with respect to a bridge offset for the AMR sensor and normalization (such that signals supply values of between −1 and 1, for example);
i) calculating the (angle-dependent) actual arcsine (ARCSIN) of the AMR sine signal (ARCSIN_AMR_AC);
j) calculating the (angle-dependent) actual arccosine (ARCCOS) of the AMR cosine signal (ARCCOS_AMR_AC);
k) calculating the (angle-dependent) actual arcsine (ARCSIN) of the xMR sine signal (ARCSIN_xMR_AC);
l) calculating the (angle-dependent) actual arccosine (ARCCOS) of the xMR cosine signal (ARCCOS_xMR_AC);
m) calculating the (angle-dependent) difference between the angle-dependent arcsine signals of the AMR sensor and the xMR sensor and between the arccosine signals of the AMR sensor and the xMR sensor.

The calculation at m) can be implemented as follows:

$$DIFF\_ARCSIN\_AC(\alpha) = ARCSIN\_xMR\_AC(\alpha) - ARCSIN\_AMR\_AC(\alpha) \qquad \text{Eq. 12}$$

$$DIFF\_ARCCOS\_AC(\alpha) = ARCCOS\_xMR\_AC(\alpha) - ARCCOS\_AMR\_AC(\alpha) \qquad \text{Eq. 13}$$

In the procedure above, there is no need for a known external reference system that produces a magnetic field with known reference angles for steps g) to m) since the phase relationship of the output signals of the AMR sensor is stable with respect to the reference system used during the calibration and the phase relationship does not change during the service life of the magnetic field sensor. Consequently, the direction of the actually applied magnetic field can be deduced in each case based on the output signals of the AMR sensor.

Figure 6:
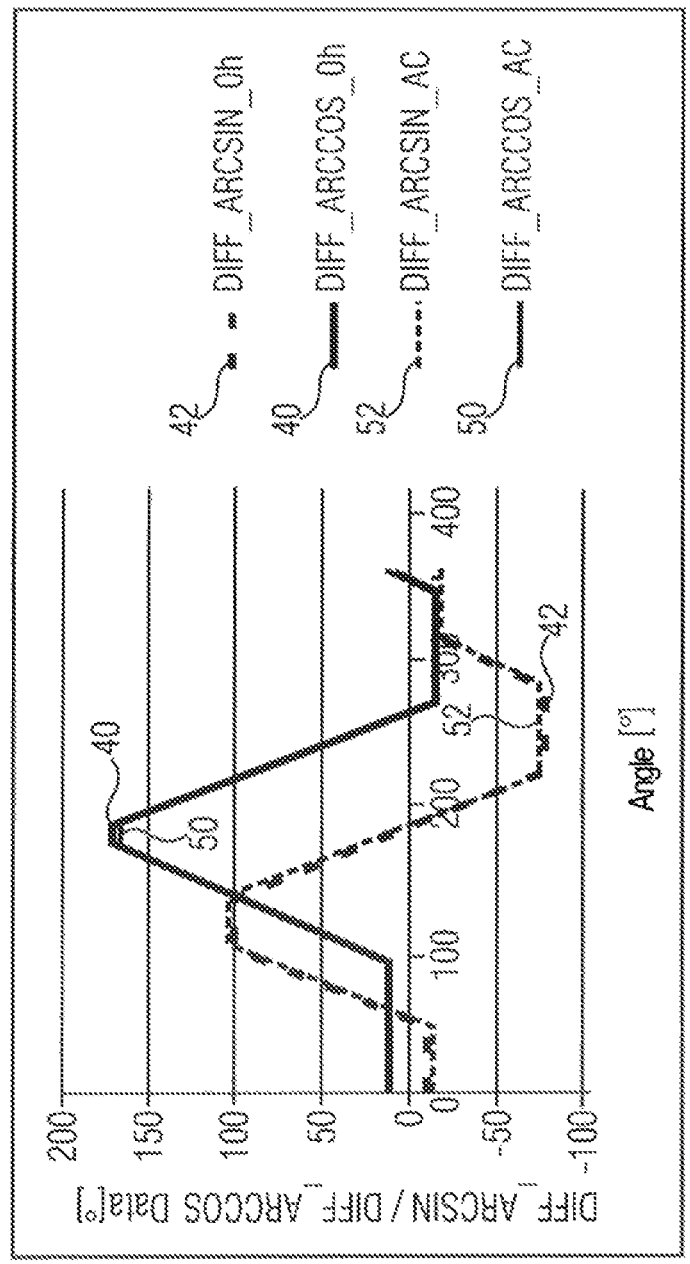
FIG. 6 shows a signal diagram showing a difference between raw data based on signals of the xMR sensor and the AMR sensor at the initial time and at a current time.
Figure 7:
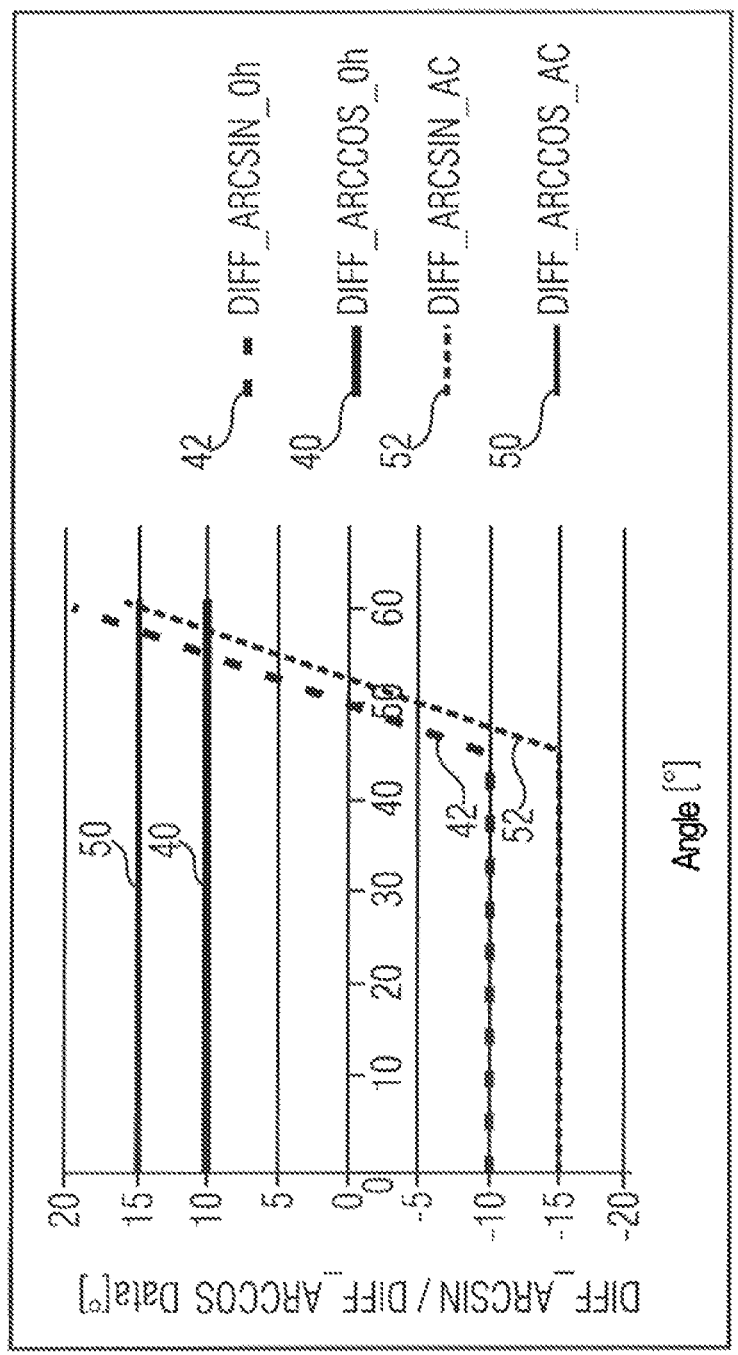
FIG. 7 shows a signal diagram showing a detailed view of the signals in FIG. 6 in an angle range from 0 to 60°.

In examples, the actual phases of the xMR output signals with respect to the AMR reference phases can be measured or determined, once again, in a specific angle range, specifically in the range of 22.5°−$P_{AMR}$(+/−22.5°) again. For the sake of an example, the assumption is made that a drift of the xMR sine signal through −5° and a drift of the xMR cosine signal through +5° have taken place up to the time of carrying out the drift compensation. FIG. 6 shows the effects of this drift on the difference signals DIFF_ARCCOS_AC(α) and DIFF_ARCSIN_AC(α). FIG. 7 shows, once again, a magnified illustration of the angle range from 0 to 60°. As can be seen best in FIG. 7, a phase difference of −15° arises between the arcsine signals of the sensors and a phase difference of +15° arises between the arccosine signals of the sensors on account of the drift of the xMR sensor that has occurred following the calibration of the latter.

The actual phase offsets, e.g., the phase differences, between the xMR output signals and the AMR reference signals can be determined as follows:

$$P\_SIN\_AC = DIFF\_ARCSIN(22.5° - P_{AMR}) \qquad \text{Eq. 14}$$

$$P\_COS\_AC = DIFF\_ARCCOS(22.5° - P_{AMR}) \qquad \text{Eq. 15}$$

Here, PSIN_AC represents the actual phase difference between the xMR sine signal and the AMR sine signal and PCOS_AC represents the actual phase difference between the xMR cosine signal and the AMR cosine signal.

The processing circuit can be designed to compensate the drift of the xMR sensor using the actual phase differences between the xMR signals and the AMR signals.

The newly detected phase differences PSIN_AC and PCOS_AC can be taken into account in order to carry out an actual correction of a non-orthogonality and a phase shift with respect to the external reference coordinate system. Here, the drift of the xMR sensor that has occurred between the calibration and the current time is compensated automatically. The current phase offset $\Delta P_{xMR\_AC}$ between the xMR output signals can be calculated as:

$$\Delta P_{xMR\_AC} = P_{Cos\_AC} - P_{Sin\_AC} \qquad \text{Eq. 16}$$

New signals, in which this phase offset $\Delta P_{xMR\_AC}$ is taken into account, can be calculated as follows:

$$V'_{xMR_{Cos\_AC}}(\alpha) = \frac{V_{xMR_{Cos}}(\alpha)}{COS(\Delta P_{xMR\_AC})} + V_{xMR_{Sin}}(\alpha) \cdot \frac{SIN(\Delta P_{xMR\_AC})}{COS(\Delta P_{xMR\_AC})} \qquad \text{Eq. 17}$$

$$V'_{xMR_{Sin\_AC}}(\alpha) = V_{xMR_{Sin}}(\alpha) \qquad \text{Eq. 18}$$

Here, $V_{xMR_{Cos\_AC}}'(\alpha)$ and $V_{xMR_{Sin\_AC}}'(\alpha)$ represent the output signals of the xMR sensor for a magnetic field to be actually measured.

The actual angle, e.g., the direction, of the external magnetic field, to be measured, in the sensor coordinate system can then be calculated as follows:

$$\alpha_{xMR\_AC} = ARCTAN\left( \frac{V'_{xMR_{Sin\_AC'}}(\alpha)}{V'_{xMR_{Cos\_AC'}}(\alpha)} \right) \qquad \text{Eq. 19}$$

This angle is related to the sensor coordinate system. Should the sensor coordinate system not correspond to the external reference coordinate system, the actual angle in the external reference coordinate system can be calculated as follows:

$$\alpha'_{xMR\_AC} = \alpha_{xMR\_AC} - P_{Sin\_AC} - P_{AMR} \qquad \text{Eq. 20}$$

Here, $P_{sin\_AC}$ represents the phase difference, determined according to Eq. 14, between the sine signals of the xMR sensor and the AMR sensor, and $P_{AMR}$ represents the phase shift of the output signals of the AMR sensor with respect to the reference coordinate system or reference angle. Then, the angle $\alpha'_{xMR\_AC}$ represents the actual direction, e.g., the actual angle, of the magnetic field, to be detected, in the reference coordinate system, wherein a zero-angle drift of the output signals of the xMR sensor has been compensated.

In examples of the present disclosure, the processing circuit is consequently designed to respectively detect the phase relationship, e.g., the phase difference, between the output signals of the xMR sensor and at least one output signal of the AMR sensor at an initial time, e.g., at an initial calibration of the magnetic field sensor, and at a later time during the service life of the magnetic field sensor. These phase differences may change during the service life of the magnetic field sensor since the output signals of the xMR sensor may drift during the service life of same. By detecting the phase differences, it is consequently possible to detect the drift and take this into account when calculating the actual angle of a magnetic field to be detected.

Figure 8:
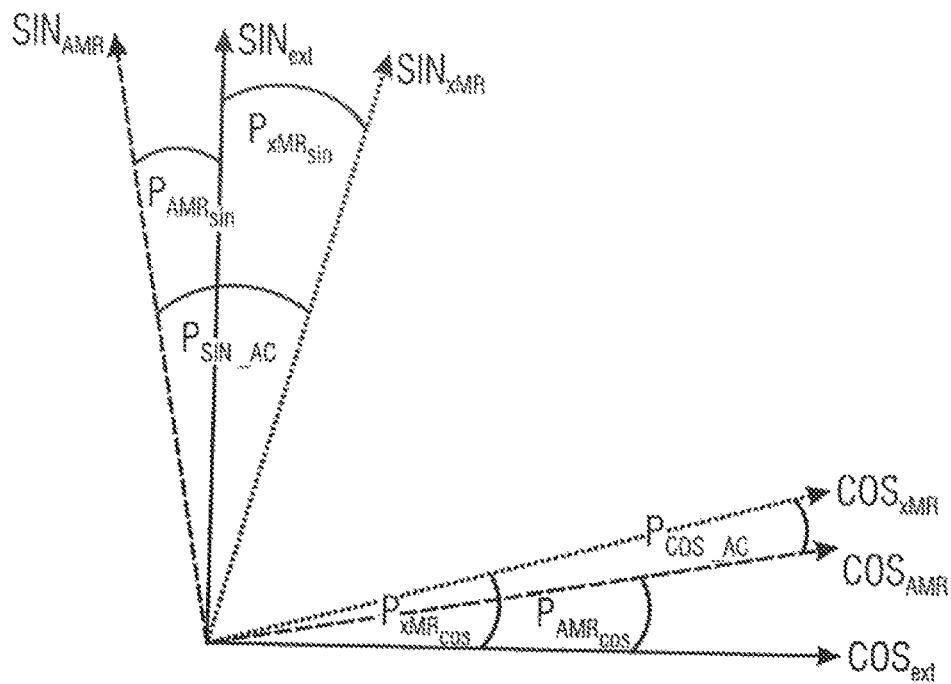
FIGS. 8 to 10 show angle diagrams showing phase offsets between output signals of the xMR sensor and the AMR sensor and signals calculated therefrom, relative to a reference coordinate system.
Figure 9:
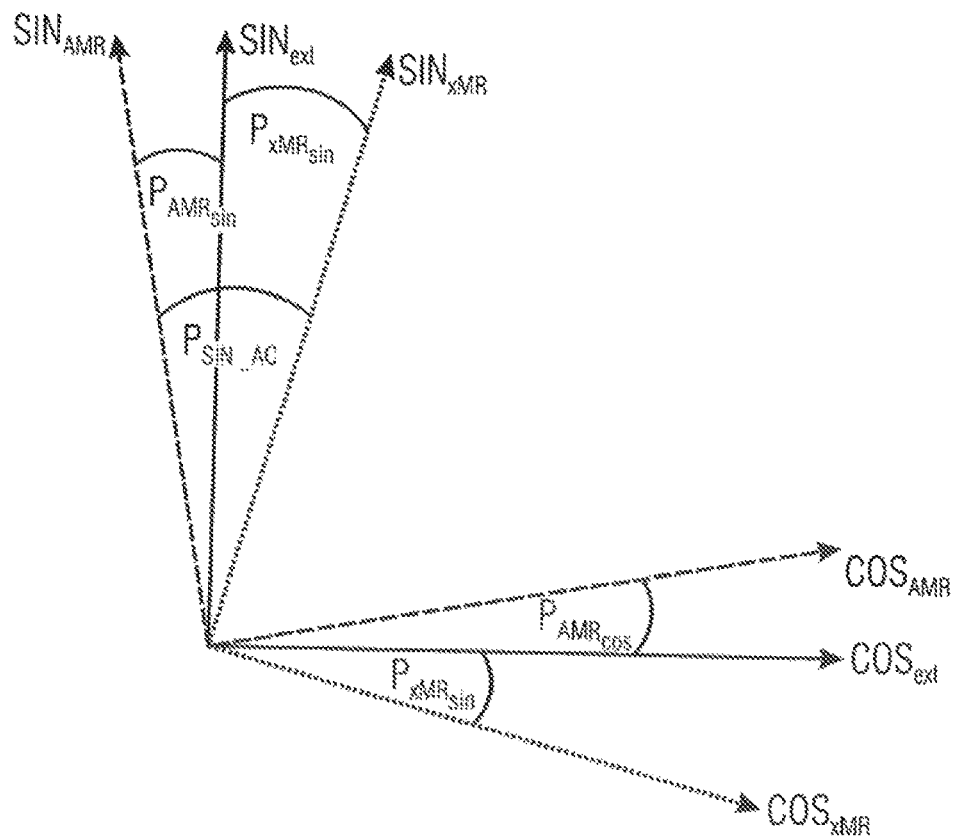
Figure 10:
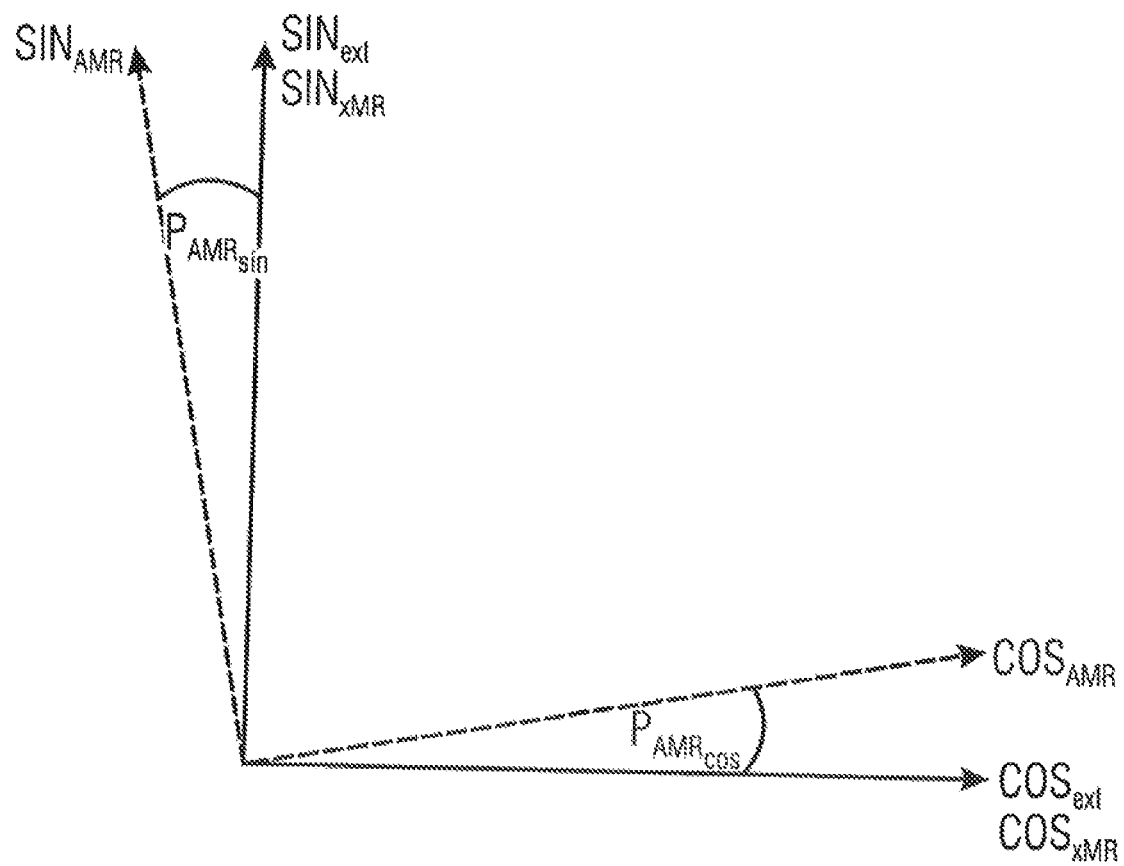

FIGS. 8 to 10 schematically show phase relationships and consequently phase differences between the occurring signals. The coordinate axes of the external reference coordinate system are denoted by $SIN_{ext}$ and $COS_{ext}$ in this case and represent reference angles. In the ideal case, the coordinate axes of the external reference coordinate system should correspond to the sensitivity axes of the magnetic field sensor. However, as described herein, there are deviations in reality, which lead to the described phase offsets.

Here, FIG. 8 illustrates the phase relationships that may occur within the scope of a measurement during the operation of the magnetic field sensor. Here, $P_{xMR_{Sin}}$ is the phase offset between the sine reference direction and the xMR sine signal $SIN_{xMR}$. $P_{AMR_{Sin}}$ is the phase offset between the sine reference direction and the AMR sine signal $SIN_{AMR}$. $P_{SIN\_AC}$ is the phase offset between the xMR sine signal $SIN_{xMR}$ and the AMR sine signal $SIN_{AMR}$. $P_{xMR_{Cos}}$ is the phase offset between the cosine reference direction and the xMR cosine signal $COS_{xMR}$. $P_{AMR_{Cos}}$ is the phase offset between the cosine reference direction and the AMR cosine signal $COS_{AMR}$. $P_{COS\_AC}$ is the phase offset between the xMR cosine signal $COS_{xMR}$ and the AMR cosine signal $COS_{AMR}$.

FIG. 9 illustrates the phase relationships following an orthogonalization of the xMR signals according to equations Eq. 17 to Eq. 19. Following the orthogonalization, the phase offset between the signals $SIN_{xMR}$ and $COS_{xMR}$ is 90°.

Then, FIG. 10 shows the situation following the compensation of the phase offset between the sine signals of the xMR sensor and the AMR sensor, e.g., $P_{SIN\_AC}$, and following the phase offset $P_{AMR}$ between the output signals of the AMR sensor and the reference coordinate system being taken into account.

In the example described above, a drift difference between the sine signal and the cosine signal of the xMR sensor is compensated by way of the orthogonalization in this case and the drift of the sine signal is then compensated by way of the compensation of the phase offset between the sine signals of the xMR sensor and the AMR sensor.

The compensation can be implemented differently in other examples. By way of example, the phase offset determined for the sine signals and the cosine signals can be applied separately in each case in order to compensate the respectively assigned drift, e.g., without initially carrying out an orthogonalization and, following this, an angle shift on the basis thereof.

In the described example, the phase differences were formed between the sine signals and cosine signals in each case. However, since the output signals of the AMR sensor are stably orthogonal with respect to one another over the running time of the magnetic field sensor, the same output signal of the AMR sensor, sine signal or cosine signal, can also be used instead to calculate both the phase difference to the sine signal of the xMR sensor and the phase difference to the cosine signal of the xMR sensor. Further, the signals can also be combined by calculation in a cross-referencing manner to produce the phase differences, e.g., a phase difference between the cosine signal of the xMR sensor and the sine signal of the AMR sensor and a phase difference between the sine signal of the xMR sensor and the cosine signal of the AMR sensor.

In the described example, the phases of the sensor signals were determined by calculating the arcsine or arccosine of the normalized signals from which the offset had been removed. In other examples, the phase angles of the signals are detected by other processes, such as, e.g., by a Fourier analysis or by determining the phase angle of extrema of the signals such as a signal maximum or signal minimum.

In examples of the disclosure, corresponding phase differences between the respective output signals of the xMR sensor and the AMR sensor can be detected and stored during the calibration and corresponding phase differences can then be detected within the scope of operation during the service life. The difference between the phase differences detected during the calibration and the subsequently detected phase differences then represents a drift of the two output signals of the xMR sensor, which can be compensated appropriately in turn.

Consequently, examples of the present disclosure facilitate a detection and correction of drifts of magnetic phases of the xMR sensor, e.g., the GMR sensor or TMR sensor, using the absolute phase of sine and/or cosine signals of the AMR sensor, the zero angle of which does not drift. This can be implemented during operation following the calibration, without an external angle reference and without any information about the actual field angle.

In examples, the xMR sensor and the AMR sensor can be integrated in one housing and can supply differential sine and cosine signals, which are then processed externally by the processing circuit. In other examples, the xMR sensor and the AMR sensor can be integrated in one housing together with the processing circuit. Examples of the present disclosure facilitate the production of accurate angle signals, in which a zero-angle drift of the xMR sensor has been compensated. Examples of the present disclosure therefore use angle sensor signals of an AMR sensor in order to compensate any drift in the angle signals of an xMR sensor. This facilitates an angle sensor with an increased accuracy.

In examples, the processing circuit can be formed by a microcontroller. In examples of the present disclosure, the processing circuit can be implemented by any suitable circuit structures, for example microprocessor circuits, ASIC (application-specific integrated circuit) circuits, CMOS (complementary metal oxide semiconductor) circuits and the like. In examples, the processing circuit can be implemented as a combination of hardware structures and machine-readable commands. By way of example, the processing circuit may comprise a processor and storage devices, which store machine-readable commands that lead to methods described herein being carried out when the commands are executed by the processor. In general, the processing circuit can be embodied to obtain and process the sine signals and cosine signals produced by the xMR sensor and the AMR sensor in order to carry out the methods described herein and implement the functionality described herein, respectively in part or in full.

Depending on implementation requirements, examples of the disclosure can be implemented as a non-transitory computer-readable medium that stores a program product with machine-readable commands that are designed to carry out methods as described herein when the commands are executed by a processor. Examples of the disclosure can be implemented as machine-readable commands that carry out signal processing, as described herein, using output signals of xMR sensors and AMR sensors, as described herein, when the commands are executed by a processor in order to determine a direction of a magnetic field to be detected. In examples, such machine-readable commands can be stored, for example, in the form of a program code on any suitable storage medium, such as, e.g., a ROM, a PROM, an EPROM, an EEPROM, or a FLASH memory. Examples of the disclosure can also be implemented as a storage medium, on which corresponding machine-readable commands are stored.

Even though some aspects of the present disclosure have been described as features in conjunction with an apparatus, it is evident that such a description can likewise be considered to be a description of corresponding method features. Even though some aspects have been described as features in conjunction with a method, it is evident that such a description can also be considered to be a description of corresponding features of an apparatus or of the functionality of an apparatus.

The disclosure above provides illustrations and descriptions. However, it is not intended to be exhaustive or restrict the implementations to the disclosed precise form. Modifications and variations are possible in light of the above disclosure or can be obtained from practice of the implementations. Even though certain combinations of features are cited in the patent claims and/or disclosed in the description, these features are not intended to limit the disclosure of possible implementations. In fact, many of these features may be combined in ways not specifically cited in the patent claims and/or disclosed in the description. Although each of the dependent patent claims cited below may directly depend only on one patent claim or some patent claims, the disclosure of possible implementations includes each dependent patent claim in combination with all other patent claims in the set of patent claims.

The examples described above merely illustrate the principles of the present disclosure. It should be understood that modifications and variations of the arrangements and of the details which are described are obvious to those skilled in the art. Therefore, the disclosure is intended to be limited only by the appended patent claims and not by the specific details which are presented for the purpose of describing and explaining the examples.

The invention claimed is:

1. A magnetic field sensor for detecting a direction of a magnetic field, comprising:
    an xMR sensor designed to produce an xMR sine signal and an xMR cosine signal based on the magnetic field;
    an AMR sensor designed to produce an AMR sine signal and/or an AMR cosine signal based on the magnetic field; and
    a processing circuit designed to:
        determine the direction of the magnetic field using the xMR sine signal, the xMR cosine signal, a first phase difference between the xMR sine signal and one of the AMR sine signal or the AMR cosine signal, and a second phase difference between the xMR cosine signal and one of the AMR sine signal or the AMR cosine signal, and
        perform, based on the direction of the magnetic field, at least one of a bridge offset correction, an amplitude correction, or a phase correction to at least one of the xMR sine signal, the xMR cosine signal, the AMR sine signal, or the AMR cosine signal.

2. The magnetic field sensor as claimed in claim 1, wherein the AMR sensor is designed to produce the AMR sine signal and the AMR cosine signal based on the magnetic field, wherein the processing circuit is designed to determine the direction of the magnetic field using the xMR sine signal, the xMR cosine signal, a first phase difference between the xMR sine signal and the AMR sine signal, and a second phase difference between the xMR cosine signal and the AMR cosine signal.

3. The magnetic field sensor as claimed in claim 1, wherein the processing circuit is designed to determine the first phase difference and the second phase difference when a magnetic field is present in the direction.

4. The magnetic field sensor as claimed in claim 3, wherein the processing circuit is designed to determine that the magnetic field is present in the direction using the AMR sine signal and/or the AMR cosine signal.

5. The magnetic field sensor as claimed in claim 3, wherein the direction lies in a range of $22.5°-P_{AMR} \pm 22.5°$, where $P_{AMR}$ is a phase offset of the AMR sine signal and/or the AMR cosine signal relative to an external reference system.

6. The magnetic field sensor as claimed in claim 5, wherein the processing circuit is designed to determine $P_{AMR}$ from the AMR sine signal and/or the AMR cosine signal when the magnetic field is present in the direction, and wherein the direction is a known direction.

7. The magnetic field sensor as claimed in claim 6, wherein the processing circuit is designed to determine $P_{AMR}$ during an initial calibration of the magnetic field sensor.

8. The magnetic field sensor as claimed in claim 1, wherein the processing circuit is designed to carry out a correction of a non-orthogonality between the xMR sine signal and the xMR cosine signal using a difference between the second phase difference and the first phase difference.

9. The magnetic field sensor as claimed in claim 8, wherein the processing circuit is designed to carry out the correction as follows:

$$V'_{xMR_{Cos_{AC'}}}(\alpha) = \frac{V_{xMR_{Cos}}(\alpha)}{\COS(\Delta P_{xMR\_AC})} + V_{xMR_{Sin}}(\alpha) \cdot \frac{\SIN(\Delta P_{xMR\_AC})}{\COS(\Delta P_{xMR\_AC})}; \text{ and}$$

$$V'_{xMR_{Sin\_AC'}}(\alpha) = V_{xMR_{Sin}}(\alpha),$$

where $V_{xMR_{Cos}}(\alpha)$ is the xMR cosine signal, $V_{xMR_{Sin}}(\alpha)$ is the xMR sine signal, $\Delta P_{xMR\_AC}$ is the difference between the second phase difference and the first phase difference, $V_{xMR_{Cos\_AC}}'(\alpha)$ is the xMR cosine signal following the correction, $V_{xMR_{Sin\_C}}'(\alpha)$ is the xMR sine signal following the correction, and a is an angle to be detected.

10. The magnetic field sensor as claimed in claim 9, wherein the processing circuit is designed to determine the direction of the magnetic field as follows:

$$\alpha_{xMR\_AC} = \ARCTAN\left(\frac{V'_{xMR_{Sin\_AC'}}(\alpha)}{V_{xMR_{Cos}\_AC'}(\alpha)}\right).$$

11. The magnetic field sensor as claimed in claim 9, wherein the processing circuit is designed to determine the direction of the magnetic field as follows:

$$\alpha'_{xMR\_AC} = \alpha_{xMR\_AC} - P_{Sin\_AC} - P_{AMR},$$

where $P_{Sin\_AC}$ is the first phase difference and $P_{AMR}$ is a phase offset of the AMR sine signal and the AMR cosine signal relative to an external reference system.

12. The magnetic field sensor as claimed in claim 1, wherein the processing circuit is designed to carry out an amplitude correction and/or a bridge offset correction with respect to the xMR sine signal and the xMR cosine signal and with respect to the AMR sine signal and/or the AMR cosine signal.

13. A method for detecting a direction of a magnetic field, comprising:
  obtaining an xMR sine signal and an xMR cosine signal based on the magnetic field using an xMR sensor;
  obtaining an AMR sine signal and/or an AMR cosine signal based on the magnetic field using an AMR sensor;
  determining the direction of the magnetic field using the xMR sine signal, the xMR cosine signal, a first phase difference between the xMR sine signal and the AMR sine signal or the AMR cosine signal, and a second phase difference between the xMR cosine signal and the AMR sine signal or the AMR cosine signal; and
  performing, based on the direction of the magnetic field, at least one of a bridge offset correction, an amplitude correction, or a phase correction to at least one of the xMR sine signal, the xMR cosine signal, the AMR sine signal, or the AMR cosine signal.

14. The method as claimed in claim 13, wherein the AMR sine signal and the AMR cosine signal are obtained based on the magnetic field, wherein the direction of the magnetic field is determined using the xMR sine signal, the xMR cosine signal, a first phase difference between the xMR sine signal and the AMR sine signal, and a second phase difference between the xMR cosine signal and the AMR cosine signal.

15. The method as claimed in claim 13, wherein the first phase difference and the second phase difference are determined when a magnetic field is present in the direction.

16. The method as claimed in claim 15, wherein the magnetic field being present in the direction is determined using the AMR sine signal and/or the AMR cosine signal.

17. The method as claimed in claim 15, wherein the direction lies in a range of $22.5° - P_{AMR} \pm 22.5°$, where $P_{AMR}$ is a phase offset of the AMR sine signal and/or the AMR cosine signal relative to an external reference system.

18. The method as claimed in claim 17, wherein $P_{AMR}$ is determined from the AMR sine signal and/or the AMR cosine signal when the magnetic field is present in the direction, and wherein the direction is a known direction.

19. The method as claimed in claim 18, wherein $P_{AMR}$ is determined during an initial calibration.

20. The method as claimed in claim 13, wherein a correction of a non-orthogonality between the xMR sine signal and the xMR cosine signal is carried out using a difference between the second phase difference and the first phase difference.

21. The method as claimed in claim 20, wherein the correction is carried out as follows:

$$V'_{xMR_{Cos}AC'}(\alpha) = \frac{V_{xMR_{Cos}}(\alpha)}{\cos(\Delta P_{xMR\_AC})} + V_{xMR_{Sin}}(\alpha) \cdot \frac{\sin(\Delta P_{xMR\_AC})}{\cos(\Delta P_{xMR\_AC})}; \text{ and}$$

$$V'_{xMR_{Sin}-AC'}(\alpha) = V_{xMR_{Sin}}(\alpha),$$

where $V_{xMR_{Cos}}(\alpha)$ is the xMR cosine signal, $V_{xMR_{Sin}}(\alpha)$ is the xMR sine signal, $\Delta P_{xMR\_AC}$ is the difference between the second phase difference and the first phase difference, $V_{xMR_{Cos}\_AC}'(\alpha)$ is the xMR cosine signal following the correction, $V_{xMR_{Sin}\_C}'(\alpha)$ is the xMR sine signal following the correction, and $\alpha$ is an angle to be detected.

22. The method as claimed in claim 21, wherein the direction of the magnetic field is determined as follows:

$$\alpha_{xMR\_AC} = \arctan\left(\frac{V'_{xMR_{Sin}-AC'}(\alpha)}{V_{xMR_{Cos}-}AC'(\alpha)}\right).$$

23. The method as claimed in claim 21, wherein the direction of the magnetic field is determined as follows:

$$\alpha'_{xMR\_AC} = \alpha_{xMR\_AC} - P_{Sin\_AC} - P_{AMR},$$

where $P_{Sin\_AC}$ is the first phase difference and $P_{AMR}$ is the phase offset of the AMR sine signal and the AMR cosine signal relative to an external reference system.

24. The method as claimed in claim 13, wherein the amplitude correction and/or the bridge offset correction is carried out with respect to the xMR sine signal and the xMR cosine signal and with respect to the AMR sine signal and/or the AMR cosine signal.

25. A non-transitory computer-readable medium storing one or more instructions, the one or more instructions comprising:
  one or more instructions that, when executed by one or more processors, cause the one or more processors to:
    obtain an xMR sine signal and an xMR cosine signal based on a magnetic field using an xMR sensor;
    obtain an AMR sine signal and/or an AMR cosine signal based on the magnetic field using an AMR sensor;
    determine a direction of the magnetic field using the xMR sine signal, the xMR cosine signal, a first phase difference between the xMR sine signal and the AMR sine signal or the AMR cosine signal, and a second phase difference between the xMR cosine signal and the AMR sine signal or the AMR cosine signal; and
    perform, based on the direction of the magnetic field, at least one of a bridge offset correction, an amplitude correction, or a phase correction to at least one of the xMR sine signal, the xMR cosine signal, the AMR sine signal, or the AMR cosine signal.

\* \* \* \* \*